(12) United States Patent
Popinciuc

(10) Patent No.: US 11,982,948 B2
(45) Date of Patent: May 14, 2024

(54) METHOD FOR DETERMINING A CENTER OF A RADIATION SPOT, SENSOR AND STAGE APPARATUS

(71) Applicant: ASML NETHERLANDS B.V., Veldhoven (NL)

(72) Inventor: Mihaita Popinciuc, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 409 days.

(21) Appl. No.: 17/618,057

(22) PCT Filed: Jun. 10, 2020

(86) PCT No.: PCT/EP2020/066021
§ 371 (c)(1),
(2) Date: Dec. 10, 2021

(87) PCT Pub. No.: WO2021/004720
PCT Pub. Date: Jan. 14, 2021

(65) Prior Publication Data
US 2022/0308468 A1 Sep. 29, 2022

(30) Foreign Application Priority Data
Jul. 8, 2019 (EP) .................................... 19185021

(51) Int. Cl.
*G03F 9/00* (2006.01)
*G01B 11/27* (2006.01)
*G03F 7/00* (2006.01)

(52) U.S. Cl.
CPC .......... *G03F 9/7026* (2013.01); *G01B 11/272* (2013.01); *G03F 7/7085* (2013.01);
(Continued)

(58) Field of Classification Search
CPC .... G03F 9/7026; G03F 9/7019; G03F 9/7034; G03F 9/7092; G03F 7/7085; G01B 11/272
See application file for complete search history.

(56) References Cited

U.S. PATENT DOCUMENTS 6,952,253 B2   10/2005   Lof et al.
7,265,364 B2   9/2007    Teunissen et al.
(Continued)

FOREIGN PATENT DOCUMENTS

CN   107917665    4/2018
JP   S61223603    10/1986
(Continued)

OTHER PUBLICATIONS

International Search Report and Written Opinion issued in corresponding PCT Patent Application No. PCT/EP2020/066021, dated Oct. 5, 2020.
(Continued)

*Primary Examiner* — Nicole M Ippolito
*Assistant Examiner* — Hanway Chang
(74) *Attorney, Agent, or Firm* — Pillsbury Winthrop Shaw Pittman, LLP

(57) ABSTRACT

A method for determining a center of a radiation spot irradiated on a surface by a sensor, the sensor including a radiation source and a detector. The method includes: emitting, with the radiation source, a first emitted radiation beam onto the surface to create the radiation spot on the surface, wherein at least a part of a target arranged at the surface is irradiated by the radiation spot; receiving, with the detector, a first reflected radiation beam at least including radiation from the radiation spot reflected by the target; detecting the presence of the target based on the first reflected radiation beam; determining a first measured position of the target
(Continued)

based on the first reflected radiation beam; and determining a center of the radiation spot as projected on the surface in at least a first direction based on the first measured position of the target.

20 Claims, 7 Drawing Sheets

(52) U.S. Cl.
CPC .......... *G03F 9/7019* (2013.01); *G03F 9/7034* (2013.01); *G03F 9/7092* (2013.01)

(56) References Cited

U.S. PATENT DOCUMENTS

| | | |
|---|---|---|
| 7,646,471 B2 | 1/2010 | Teunissen et al. |
| 2008/0024781 A1 | 1/2008 | Zangooie et al. |
| 2010/0233600 A1 | 9/2010 | Den Boef et al. |
| 2015/0097126 A1 | 4/2015 | McCord et al. |

FOREIGN PATENT DOCUMENTS

| | | |
|---|---|---|
| JP | H01170806 | 7/1989 |
| JP | H09076083 | 3/1997 |
| JP | 2002196223 | 7/2002 |
| JP | 2018139010 | 9/2018 |
| WO | 2016102127 | 6/2016 |

OTHER PUBLICATIONS

Office Action issued in corresponding Japanese Patent Application No. 2021-572525, dated Feb. 17, 2023.

METHOD FOR DETERMINING A CENTER OF A RADIATION SPOT, SENSOR AND STAGE APPARATUS

CROSS-REFERENCE TO RELATED APPLICATIONS

This application is the U.S. national phase entry of PCT Patent Application No. PCT/EP2020/066021 which was filed on Jun. 10, 2020, which claims the benefit of priority of European Patent Application No. 19185021.3 which was filed on Jul. 8, 2019 and which is incorporated herein in its entirety by reference.

FIELD

The present invention relates to a method for determining a center of a radiation spot irradiated on a surface by a sensor, a method for calibrating a sensor, a sensor, a stage apparatus, an apparatus comprising a stage apparatus, and a device manufacturing method.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device, e.g., a mask onto a layer of radiation-sensitive material (resist) provided on a substrate, e.g., a wafer. An inspection apparatus is for example suitable for inspecting a pattern which has been applied to an object, e.g., to a substrate.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

At various stages of the lithographic process, an apparatus configured to irradiate a surface with a radiation spot may be used. For example, a level sensor or height sensor may be used to determine a height map or height profile of a substrate, e.g., a wafer. In practice, for example, due to tolerances in manufacturing and calibration, the location of the center of the radiation spot on a surface of the object may be unknown. This may result in the actual position of the radiation spot being unknown, and therefore inaccuracies in measurement results may be introduced.

SUMMARY

It is an object of the invention to provide a way to determine or at to least estimate a center of a radiation spot irradiated on a surface by an apparatus, e.g., a sensor.

This object is achieved with a method for determining a center of a radiation spot irradiated on a surface by a sensor, said sensor comprising a source of radiation and a detector. The source of radiation, may be a radiation source arranged remotely from the sensor providing radiation to the sensor as used for the method. The method comprises the following steps: emitting, with the radiation source, a first emitted radiation beam onto the surface to create the radiation spot on the surface, wherein at least a part of a target (or an object of interest) arranged at the surface is irradiated by the radiation spot; receiving, with the detector, a first reflected radiation beam at least comprising radiation from the radiation spot reflected by the target; detecting the presence of the target based on the first reflected radiation beam; determining a first measured position of the target based on the first reflected radiation beam; determining a center of the radiation spot as projected on the surface in at least a first direction based on the first measured position of the target.

In accordance with the invention, the first reflected radiation beam is received by the detector, comprising radiation reflected by the target (e.g., a mark). From the first reflected radiation beam, the first measured position of the target may be determined, providing information from which the center of the radiation spot may be determined. Within the context of this invention, determining the center of the radiation spot is to be understood as determining the location of the center of the radiation spot on the surface. The step of determining the center of the radiation spot may be achieved in several ways, e.g., according to the examples explained herein. For example, in some embodiments known or earlier determined information relating to the target may be taken into account, e.g., relating to the position or an asymmetry of the target. For example, in some embodiments additional measured positions may be determined to provide additional information to derive the center of the radiation spot. Herewith, the sensor can be calibrated.

In an embodiment, the surface at which the target is arranged is an upper surface of a calibration object, and the determining the first measured position of the target is done while the calibration object is in a first position. The method further comprises the following steps: after receiving the first reflected radiation beam while the calibration object is in the first position, arranging the calibration object in a second position wherein the calibration object is at least rotated relative to the first position; emitting, with the radiation source, a second emitted radiation beam onto the surface to create the radiation spot, wherein at least a part of the target is irradiated by the radiation spot; receiving, with the detector, a second reflected radiation beam at least comprising radiation from the radiation spot reflected by the target while the calibration object is in the second position; detecting the presence of the target based on the second reflected radiation beam; determining a second measured position of the target based on the second reflected radiation beam. In this embodiment, the step of determining the center of the radiation spot is done based on both the first measured position and the second measured position of the target. Advantageously a calibration object is provided, and a second measured position of the target is determined in this embodiment. As such additional information is provided, from which the center of the radiation spot can be determined more accurately.

In a further embodiment, the calibration object is rotated by 170 to 190 degrees around an axis substantially perpendicular to the upper surface, preferably by substantially 180 degrees, in the second position relative to the first position. Advantageously the target will be in an approximately opposite position in the second position relative to the first position, when seen in the first direction. This allows simplifying the determination of the center of the radiation spot, as the contribution of the actual position of the target to the measured position will be approximately opposite for in the first measured position relative to the second measured position.

In an embodiment, further a center of the radiation spot is determined in at least a second direction. Advantageously the center of the radiation spot in a plane can be determined, e.g., in the horizontal plane.

In an embodiment, the step of arranging the calibration object in the second position includes aligning the calibration object using measurement data obtained by an alignment sensor. Optionally, also the step of arranging the calibration object in the first position includes aligning the calibration object using measurement data obtained by an alignment sensor. Advantageously the use of the alignment sensor and the measurement data obtained by the alignment sensor, allow positioning the calibration object accurately.

In an embodiment of the method according to the invention, the surface at which the target is arranged is a surface of an object holder configured to hold an object which is to be subjected to a measurement of the sensor. Advantageously the center of the radiation spot may be determined using the object holder, which is already present to fulfil other functionalities.

In an embodiment, the method further comprises the step of determining at least a first alignment position of the target (e.g., an alignment mark) with an alignment sensor, wherein the determining of the center of the radiation spot is further done based on the first alignment position. Advantageously the first alignment position provides additional information allowing to determine the center of the radiation spot more accurately. For example, a difference between the first measured position and the first alignment position may be used to determine the center of the radiation spot.

In an embodiment, the determining of the center of the radiation spot is further based on an optical interaction parameter of the target, said optical interaction parameter representing an asymmetry or a non-uniformity in the first reflected radiation beam caused by the target. Advantageously the optical interaction parameter provides additional information allowing to determine the center of the radiation spot more accurately.

In an embodiment the method further comprises a step of determining a correction factor, e.g., a calibrated tilt invariant point, for correcting measurements obtained by the sensor in a third direction. Advantageously the combination of the correction factor and the determined center of the radiation spot may be used to further increase the accuracy of the measurement results of the sensor.

The invention further relates to a method for calibrating a sensor comprising a radiation source and a detector, said method comprising a step of determining a center of a radiation spot irradiated on a surface by the sensor according to a method according to the invention. The method further comprises the step of configuring a processing unit to, based on the determined center of the radiation spot: adjust a measurement or measurement data obtained by the sensor; and/or adjust, for an object which is to be subjected to a measurement of the sensor, which area of a surface of said object is to be irradiated with the radiation spot. Advantageously the determined center of the radiation spot is used to calibrate the sensor. This may be done by correcting the output of the sensor, i.e., the measurement or measurement data, and/or by correcting the input of the sensor, i.e., the area to irradiate, for example to ensure that the radiation spot is completely on the surface to be irradiated.

The object of the invention is also achieved with a sensor. Therefore, the invention further relates to a sensor comprising: a radiation source configured to emit first emitted radiation beam onto a surface to create a radiation spot, wherein at least a part of a target arranged at the surface is irradiated by the radiation spot; a detector configured to receive a first reflected radiation beam at least comprising radiation from the radiation spot reflected by the target; and a processing unit. The processing unit may be configured to: detect the presence of the target based on the first reflected radiation beam; determine a first measured position of the target based on the first reflected radiation beam; and determine a center of the radiation spot as projected on the surface in at least a first direction based on the first measured position of the target. Advantageously the sensor according to the invention is configured to detect the presence of the target and determine the center of the radiation spot.

In an embodiment the processing unit is configured to detect the presence of the target based on a characteristic of the first reflected radiation beam exceeding a threshold. For example, the target may be detected when an intensity of the first reflected radiation beam changes.

The invention further relates to a stage apparatus comprising a sensor according to the invention. The stage apparatus further comprises: an object holder configured to hold an object which is to be subjected to a measurement of the sensor; an object handler configured to arrange the object on the object holder; and a control unit. The control unit is configured to: control the object handler to arrange a calibration object on the object holder in a first position, wherein said target is arranged at an upper surface of the calibration object; and after the detector of the sensor has received the first reflected radiation beam while the calibration object is in the first position, arrange the calibration object in a second position wherein the calibration object is at least rotated relative to the first position. The processing unit of the sensor is further configured to: determine a second measured position of the target, based on a second reflected radiation beam received by the detector and at least comprising radiation from the radiation spot reflected by the target when the calibration object is in the second position and the radiation source emits a second emitted radiation beam onto the surface to create the radiation spot such that at least a part of the target is irradiated by the radiation spot; and determine the center of the radiation spot based on both the first measured position and the second measured position of the target. Advantageously a calibration object can be provided, and a second measured position of the target may be determined in this embodiment. As such additional information is provided, from which the center of the radiation spot can be determined more accurately.

In a further embodiment, the object handler is configured to arrange the calibration object in the second position such that the calibration object is rotated by 170 to 190 degrees around an axis substantially perpendicular to the upper surface, preferably by substantially 180 degrees, relative to the first position. Advantageously the target will be in an approximately opposite position in the second position relative to the first position, when seen in the first direction. This allows to simplify the determination of the center of the radiation spot as the contribution of the actual position of the target to the measured position, will be approximately opposite for in the first measured position relative to the second measured position.

In an embodiment the stage apparatus further comprises an alignment sensor, wherein the control unit is configured to control the object handler to arrange the calibration object in the second position using measurement data obtained by the alignment sensor. Optionally the control unit is also configured to control the object handler to arrange the calibration object in the first position using measurement data obtained by the alignment sensor. Optionally the control unit is also configured to control the object handler to arrange the calibration object in the second position using measurement data obtained by the alignment sensor. Advantageously the use of the alignment sensor and the measurement data obtained by the alignment sensor, allow to position the calibration object accurately.

The invention further relates to a stage apparatus comprising a sensor according to the invention. The stage apparatus further comprises an object holder configured to hold an object which is to be subjected to a measurement of the sensor, wherein the surface at which the target is arranged is a surface of the object holder. Advantageously the center of the radiation spot can be determined using the object holder which is already present to fulfil other functionalities.

In an embodiment a stage apparatus according to the invention further comprises an alignment sensor configured to determine a first alignment position of the target, wherein the processing unit further is configured to determine the center of the radiation spot based on the first alignment position. on the first alignment position. Advantageously the first alignment position provides additional information allowing to determine the center of the radiation spot more accurately. For example, a difference between the first measured position and the first alignment position may be used to determine the center of the radiation spot.

The invention further relates to an apparatus comprising a stage apparatus according to the invention. Said apparatus may, for example, be a lithographic apparatus, a metrology apparatus, a particle beam apparatus, an electron beam apparatus, an electron beam inspection apparatus, a shaping apparatus for forming a three-dimensional object on a target surface, or an inspection apparatus. Advantageously the apparatus can be used more accurately by taking into account the determined center of the radiation spot.

The invention further relates to a device manufacturing method comprising transferring a pattern from a patterning device onto a substrate, comprising the step of using, for example, a lithographic apparatus comprising a stage apparatus according to the invention. Advantageously the device can be manufactured more accurately by taking into account the determined center of the radiation spot.

BRIEF DESCRIPTION OF THE DRAWINGS

Embodiments of the invention will now be described, by way of example only, with reference to the accompanying schematic drawings, in which the same reference numbers indicate the same or similar features. In the drawings.

DETAILED DESCRIPTION

In the present document, the terms "radiation" and "beam" are used to encompass all types of electromagnetic radiation, including ultraviolet radiation (e.g., with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
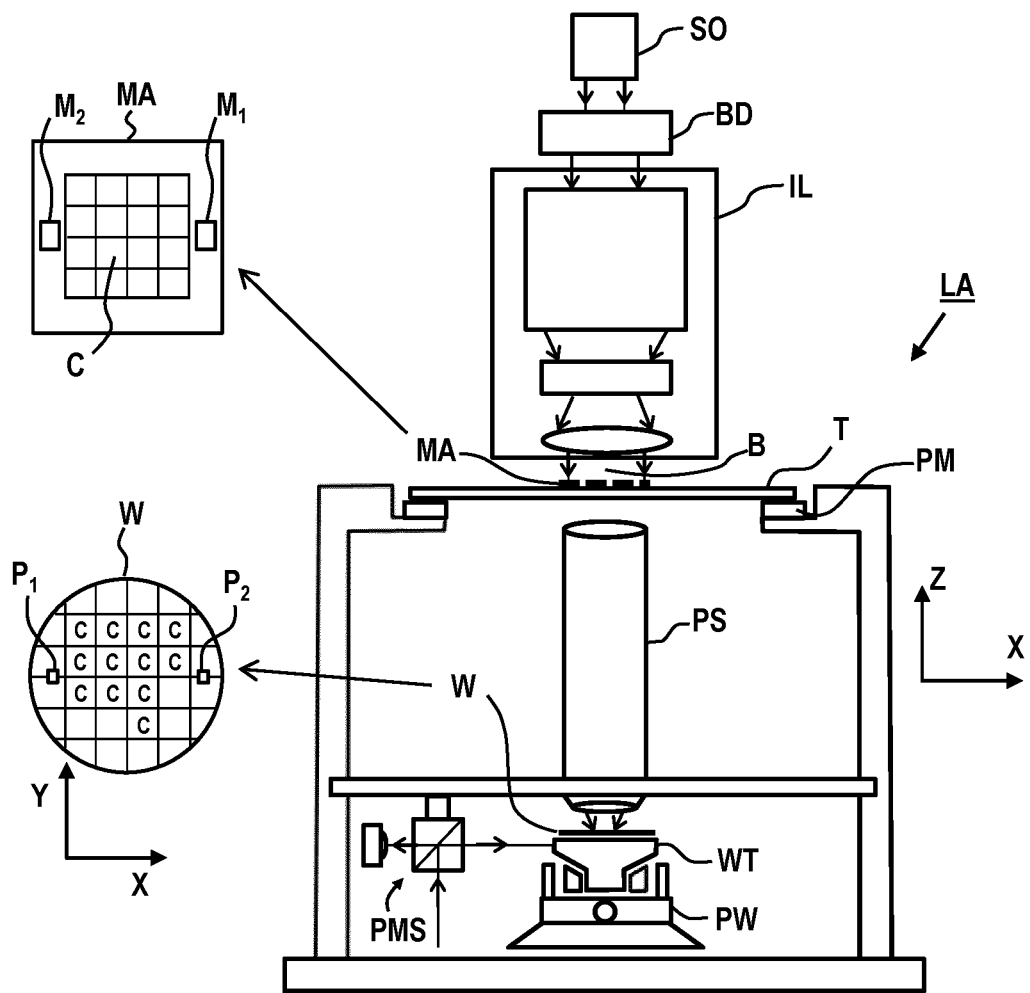
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment targets M1, M2 and substrate alignment targets P1, P2. Although the substrate alignment targets P1, P2 as illustrated occupy dedicated target portions, they may be located in spaces between target portions. Substrate alignment targets P1, P2 are known as scribe-lane alignment targets when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

A topography measurement system, level sensor or height sensor, and which may be integrated in the lithographic apparatus, may be arranged to measure a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 2:
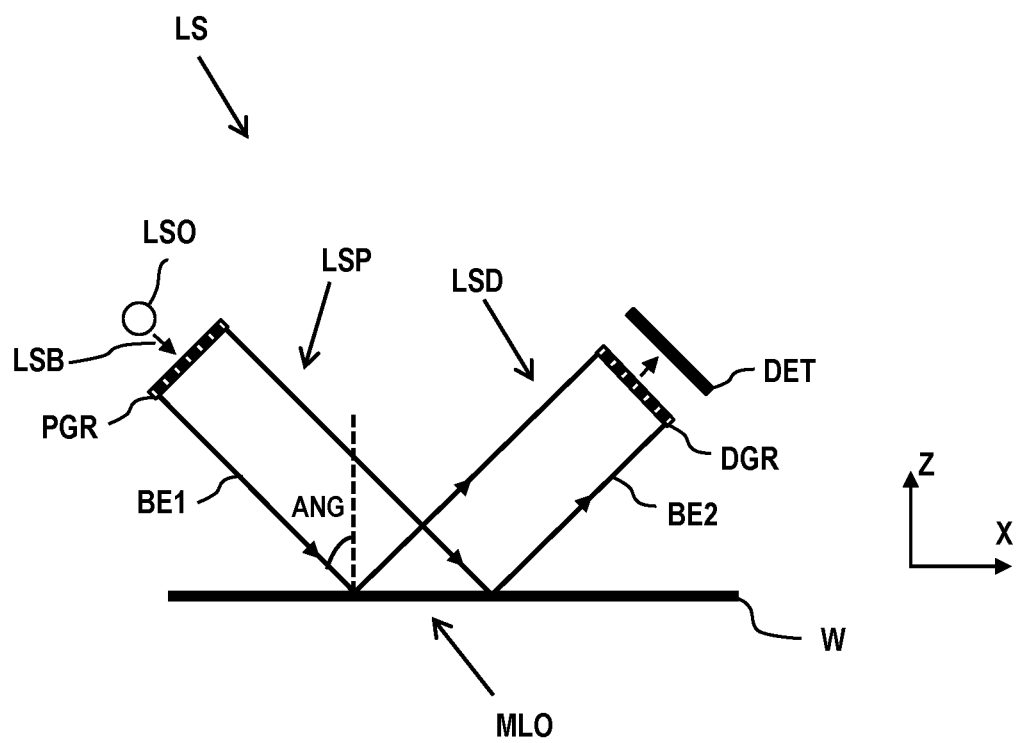
FIG. 2 illustrates the principles of operation of a level or height sensor.

An example of a level or height sensor LS as known in the art is schematically shown in FIG. 2, which illustrates only the principles of operation. In this example, the level sensor comprises an optical system, which includes a projection unit LSP and a detection unit LSD. The projection unit LSP comprises a radiation source LSO providing a beam of radiation LSB which is imparted by a projection grating PGR of the projection unit LSP. The radiation source LSO may be, for example, a narrowband or broadband radiation source, such as a supercontinuum light source, polarized or non-polarized, pulsed or continuous, such as a polarized or non-polarized laser beam. The radiation source LSO may include a plurality of radiation sources having different colors, or wavelength ranges, such as a plurality of LEDs. The radiation source LSO of the level sensor LS is not restricted to visible radiation, but may additionally or alternatively encompass UV and/or IR radiation and any range of wavelengths suitable to reflect from a surface of a substrate.

The projection grating PGR is a periodic grating comprising a periodic structure resulting in a beam of radiation BE1 having a periodically varying intensity. The beam of radiation BE1 with the periodically varying intensity is directed towards a measurement location MLO on a substrate W having an angle of incidence ANG with respect to an axis perpendicular (Z-axis) to the incident substrate surface between 0 degrees and 90 degrees, typically between 70 degrees and 80 degrees. At the measurement location MLO, the patterned beam of radiation BE1 is reflected by the substrate W (indicated by arrows BE2) and directed towards the detection unit LSD.

In order to determine the height level at the measurement location MLO, the level sensor further comprises a detection system comprising a detection grating DGR, a detector DET and a processing unit (not shown) for processing an output signal of the detector DET. The detection grating DGR may be identical to the projection grating PGR. The detector DET produces a detector output signal indicative of the light received, for example indicative of the intensity of the light received, such as a photodetector, or representative of a spatial distribution of the intensity received, such as a camera. The detector DET may comprise any combination of one or more detector types.

By means of triangulation techniques, the height level at the measurement location MLO can be determined. The detected height level is typically related to the signal strength as measured by the detector DET, the signal strength having a periodicity that depends, amongst others, on the design of the projection grating PGR and the (oblique) angle of incidence ANG.

The projection unit LSP and/or the detection unit LSD may include further optical elements, such as lenses and/or mirrors, along the path of the patterned beam of radiation between the projection grating PGR and the detection grating DGR (not shown).

In an embodiment, the detection grating DGR may be omitted, and the detector DET may be placed at the position where the detection grating DGR is located. Such a configuration provides a more direct detection of the image of the projection grating PGR.

In order to cover the surface of the substrate W effectively, a level sensor LS may be configured to project an array of measurement beams BE1 onto the surface of the substrate W, thereby generating an array of measurement areas MLO or spots covering a larger measurement range.

Various height sensors of a general type are disclosed for example in U.S. Pat. Nos. 7,265,364 and 7,646,471, both incorporated by reference. A height sensor using UV radiation instead of visible or infrared radiation is disclosed in US2010233600A1, incorporated by reference. In WO2016102127A1, incorporated by reference, a compact height sensor is described which uses a multi-element detector to detect and recognize the position of a grating image, without needing a detection grating.

Figure 3:
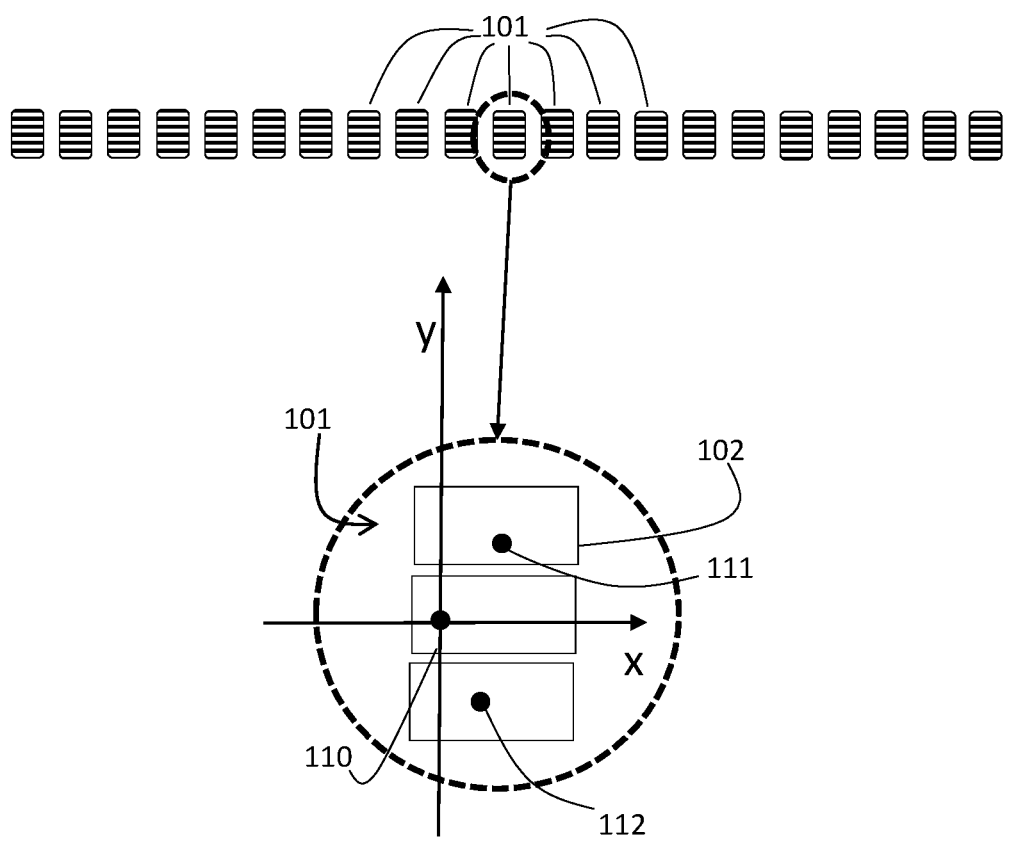
FIG. 3 shows an example of an array of measurement areas or radiation spots, which may for example be emitted onto a surface.

FIG. 3 shows an example of an array of measurement areas or spots 101 that may be emitted onto a surface, for example, by the level sensor LS shown in FIG. 2. In FIG. 3, one radiation spot 101, in this case a center spot, is shown enlarged. The radiation spot 101 may comprise a plurality of spot portions 102, due to a plurality of beams.

In practice, the measurements obtained by the level sensor may not be completely accurate. One contributing factor to this is that the object may be tilted by an unknown degree. It is known to calibrate the level sensor for corrections in the z-direction. For example, a calibrated tilt invariant point 112 may be determined for the radiation spot 101. The tilt invariant point 112 may be a location of the radiation spot 101 for which a measurement is substantially insensitive for the tilt of the object. To compensate the measurements obtained with the level sensor for unknown tilt of the object, the level sensor is configured to associate the measurement result, i.e., the height of the object, with the location of the calibrated tilt invariant point 112 on the object.

In the radiation spot 101, a center 111 may be determined. Although in an ideal situation, the calibrated tilt invariant point 112 and the center 111 coincide, in practice this may differ. This may, for example, be caused by tolerances, for example, manufacturing tolerances, or by the set-up of the projection unit relative to the detection unit.

FIG. 3 further illustrates that a coordinate system with an origin 110 may be defined. Optionally the coordinate system and the radiation spot 101 remain in substantially the same position relative to each other. For example, an object that is to be subjected to a measurement of the sensor may be moved relative to both of the origin 110 of the coordinate system and the radiation spot 101 (e.g., using the first position PM as explained herein). Optionally both the origin 110 of the coordinate system and the radiation spot 101 remain in substantially the same position.

Optionally the coordinate system is associated with another sensor. For example, in a lithographic apparatus an alignment sensor may be present. The alignment sensor may be configured to detect an alignment target when said alignment target is at the origin 110, for example, to determine a position of the alignment target relative to an object table on which the object may be arranged.

The calibrated tilt invariant point 112 may, for example, be determined as follows during a calibration. The object, or a test object or calibration object, may be tilted around the y-axis through the origin 110 by a known angle $\alpha_1$. The measurement obtained by the level sensor, representing the height, may be expressed as $Z_1 = cst + \alpha_1 * TIPx$, wherein $Z_1$ represents the determined height, cst is an unknown constant and TIPx represents x-coordinate of the tilt invariant point 112 expressed in coordinates relative to the origin 110. By tilting the object, or a test object or calibration object, at multiple angles, multiple equations can be determined, from which TIPx can be determined. Similarly, TIPy may be determined by tilting the object, or a test object or calibration object, around the x-axis through the origin 110 by a known angle.

Figure 4:
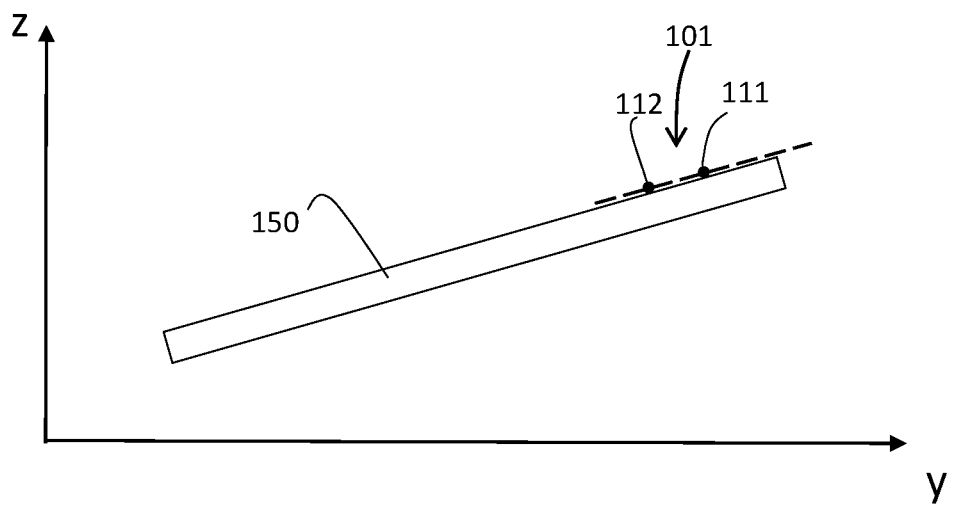
FIG. 4 schematically illustrates a situation wherein the level sensor irradiates a tilted object with the radiation spot.

FIG. 4 schematically illustrates a situation, wherein the level sensor irradiates the radiation spot 101 on a tilted object 150. It is noted that the size of the radiation spot 101 and the angle of tilt may be exaggerated in FIG. 4 for the sake of clarity. In the shown situation, the calibrated tilt invariant point 112 is used as reference, and deviates an unknown distance from the center 111. When the radiation spot 101 approaches outer borders of the object 150, a part of the radiation spot 101 is irradiated outside of the object 150 in radial direction. This may result in inaccurate measurements with the level sensor, since an incorrect height is measured for at least a part of the radiation spot.

Such problems may, for example, occur in a lithographic process wherein the object is a substrate, e.g., a wafer. The increasing desire to use the substrate as efficiently as possible lead to a smaller border area of which no measurements are required, said border area also being referred to as focus exclusion area. As the focus exclusion area approximates zero it becomes smaller than the distance between the calibrated tilt invariant point 112 and the center 111, resulting in inaccurate measurements as explained above.

Figure 5A:
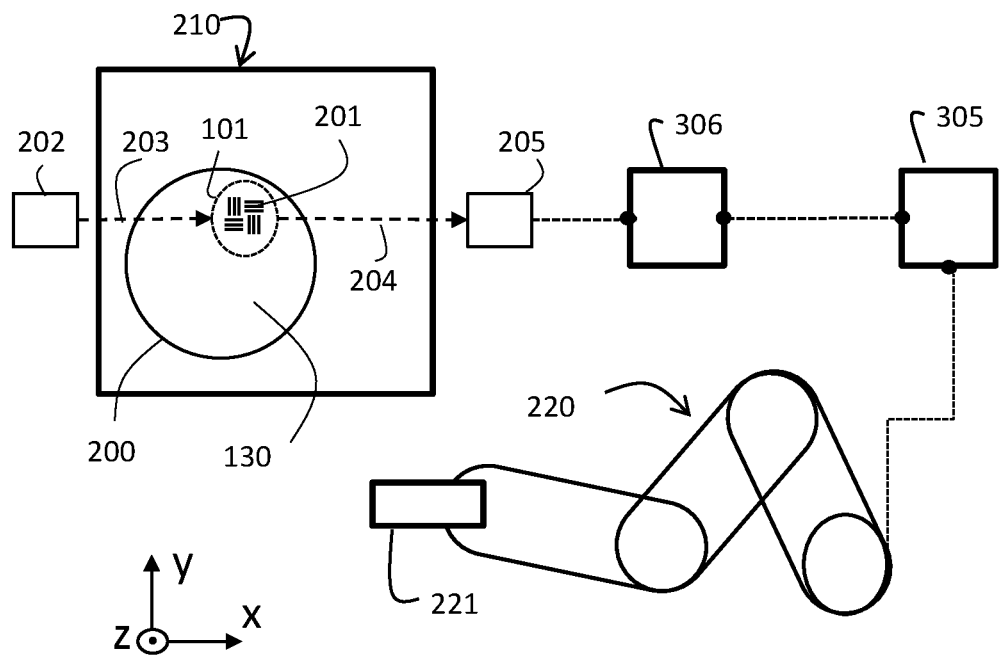
FIGS. 5a-5c schematically illustrate an embodiment according to the invention.
Figure 5B:
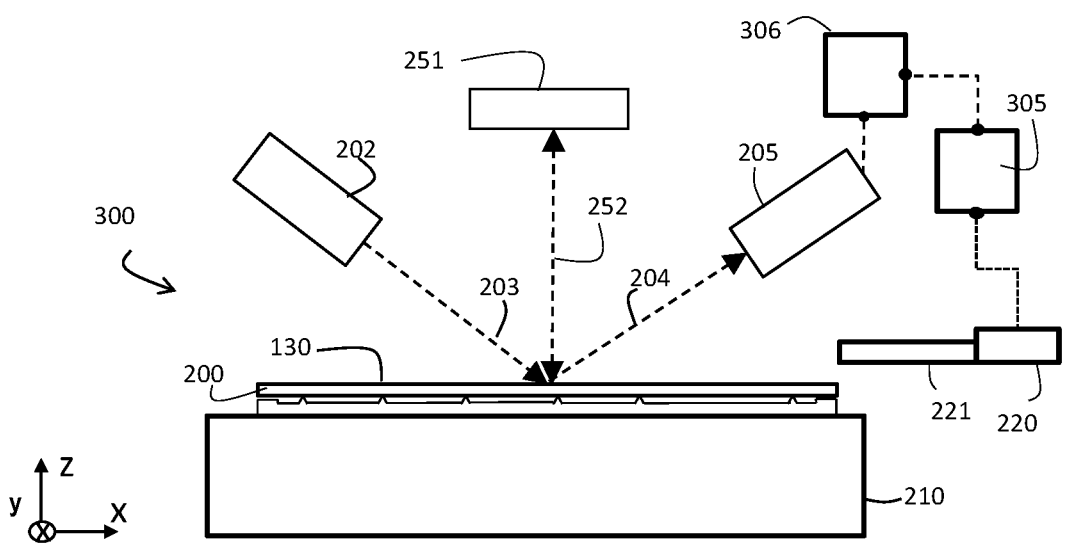
Figure 5C:
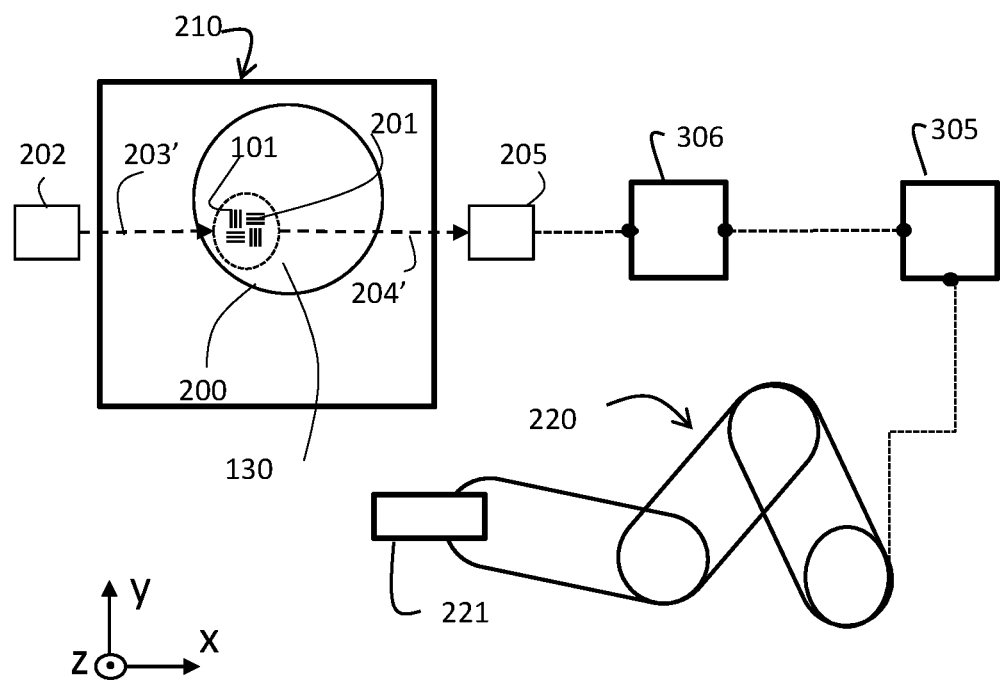

FIGS. 5a-5c schematically illustrate an embodiment of the invention. FIG. 5a shows a top view, FIG. 5b shows a side view, and FIG. 5c shows a top view. The invention relates to methods and to devices such as a sensor, as well as devices and apparatuses incorporating the sensor. The devices according to the invention may be used to perform the methods according to the invention, but are not limited thereto. Similarly, the methods according to the invention may be performed with the devices according to the invention, but are not limited thereto. Any features or embodiments explained herein with reference to the methods according to the invention can be applied in similar ways to the devices according to the invention, and vice versa.

The method according to the invention is a method for determining a center of a radiation spot 101 irradiated on a surface 130 by a sensor, said sensor comprising a radiation source 202 and a detector 205. The method comprises the following steps: emitting, with the radiation source 202, a first emitted radiation beam 203 onto the surface 130 to create the radiation spot 101 on the surface 130, wherein at least a part of a target 201 arranged at the surface 130 is irradiated by the radiation spot 101; receiving, with the detector 205, a first reflected radiation beam 204 at least comprising radiation from the radiation spot 101 reflected by the target 201; detecting the presence of the target 201 based on the first reflected radiation beam 204; determining a first measured position of the target 201 based on the first reflected radiation beam 204; determining a center of the radiation spot 101 as projected on the surface 130 in at least a first direction X based on the first measured position of the target 201.

The invention also relates to a sensor comprising: a radiation source 202 configured emit first emitted radiation beam 203 onto a surface 130 to create a radiation spot 101, wherein at least a part of a target 201 arranged at the surface 130 is irradiated by the radiation spot 101; a detector 205 configured to receive a first reflected radiation beam 204 comprising at least radiation from the radiation spot 101 reflected by the target 201; and a processing unit 306. The processing unit 306 is configured to: detect the presence of the target 201 based on the first reflected radiation beam 204; determine a first measured position of the target 201 based on the first reflected radiation beam 204; and determine a center of the radiation spot 101 as projected on the surface 103 in at least a first direction X based on the first measured position of the target 201. The sensor according to the invention may be, for example, the level sensor LS as shown in FIG. 2, wherein the radiation source LSO may correspond with the radiation source 202, and the detector DET with the detector 205.

The radiation source 202 may be, for example, a narrowband or broadband radiation source, such as a supercontinuum light source, polarized or non-polarized, pulsed or continuous, such as a polarized or non-polarized laser beam. The radiation source 202 may include a plurality of radiation sources having different colors, or wavelength ranges, such as a plurality of LEDs. The radiation source 202 of the sensor is not restricted to visible radiation, but may additionally or alternatively encompass UV and/or IR radiation and any range of wavelengths suitable to reflect from a surface of an object.

In an embodiment, the sensor may also be configured to emit the first emitted radiation beam 203 onto an substrate (e.g., a wafer) to be submitted or already submitted to a lithographic process.

In accordance with the invention, the first reflected radiation beam 204 is used to determine a center of the radiation spot 101. The first reflected beam 204 comprises radiation from the radiation spot reflected by the surface 130 and the target 201, which is present at the surface 130. From the first reflected radiation beam 204, the target 201 may be detected and the first measured position of the target 201 can be determined. The target 201 may in general be anything that has a different reflectivity to the radiation spot 101 than the surface 130. In the shown embodiment, the target 201 is an alignment mark (for example an orthobox), of which the size in the figures may be exaggerated for the sake of clarity. However, any shape or material could be used. Because the target 201 has a different reflectivity, the first reflected radiation beam 204 changes when the radiation spot 101 irradiates the target 201. This may be detected by the detector 205, due to a change in intensity of the first reflected radiation beam 204. In an embodiment, the processing unit 306 may be configured to the presence of the target 201 based on a characteristic of the first reflected radiation beam 204 exceeding a threshold, for example, an intensity threshold that may be characterized by a DC signal generated by the detector 205.

At a substrate, for example a wafer or a sensor plate, a target may be present that has a different optical interaction with the radiation spot 101 compared with the surrounding area. For example, the target may have a different reflectivity compared with the surrounding area. This may result in a DC signal generated by the detector 20, which may be proportional to the surface reflectivity, that is different when measuring at the target 201 and when measuring next to the target 201 (the surrounding), provided that the difference is above the detector noise level. Performing a 2D-scan at (around) the target and tracing the DC signal level, a 2D-map representing a convolution of the target 201 with the radiation spot 101 may be obtained. Identifying all positions i where the spot convolutes with the target, the first measured position, in X-direction, may be formulated mathematically as follows:

$$X_{meas} = \frac{\sum_{i=1}^{n} X_i \times W_i}{\sum_{i=1}^{n} W_i}. \tag{1}$$

In this formula (1), $X_{meas}$ is known from the measurement, being the first measured position. $W_i$ is a weighing factor based on the intensity of the first reflected radiation beam 204. $W_i$ may be derived from the DC signal generated by the detector. Using the weighing factors $W_i$ in formula (1) above results in $X_{meas}$ corresponding with a center of mass of the radiation spot. Determining the center-of-mass as $X_{meas}$ with formula (1) above may be used to associate the measurement result, i.e., the height of the object, with an appropriate location of the object. This may be useful, for example, when a part of the radiation spot 101 is irradiated with relatively low intensity. In such a situation, the part that is less irradiated provides less information. It may then be more appropriate to associate the measurement result with the center-of-mass (COM) 111 instead of the geometric center.

A threshold may be applied to the 2D-map in order to calculate the coordinates.

The same method applies for a second direction Y, in order to derive $Y_{meas}$. That is, the method is not limited to a single direction, but does apply for the orthogonal directions with respect to the first direction (X-direction).

Alternatively, formula (1) may be rewritten as follows:

$$X_{meas} = \Sigma_{i=1}^{n} X_i. \tag{2}$$

Without the weighing factors, the geometric center of the radiation spot 101 in the X-direction may be determined as $X_{meas}$ by means of formula (2). Determining the geometric center of the radiation spot 101 as $X_{meas}$ allows to determine exact location of said center and therefore of the radiation spot 101. This may be useful to ensure the correct area of the surface 130 is irradiated by the radiation spot 101, for example, to avoid that a part of the radiation spot 101 is irradiated outside of the substrate.

In the case of the target 201, the relevant contributing factors to $X_{meas}$ may be assumed to be in accordance with formula (3) below:

$$X_{meas} = X_{201} + X_{int} - X_{111}. \tag{3}$$

In this formula, $X_{201}$ is the actual geometrical center of the target in X-direction, $X_{int}$ is a term that represents the optical interaction effects (spectral, diffraction, interference, non-uniform reflectivity effects etc.), and $X_{111}$ represents the center-of-mass of the radiation spot 101. For example, $X_{int}$ may represent an asymmetry or a non-uniformity of the target in the X-direction. So, the deviation of the first measured position $X_{meas}$ from the actual geometric center $X_{201}$ of the target 201 may be at least partly contributed to the center of the radiation spot 101, which may be unknown. However, using the measured position $X_{meas}$, said center 111 may be determined by using the formulas above. Optionally $X_{meas}$, $X_{201}$, $X_{int}$, and $X_{111}$ may be expressed relative to a coordinate system, for example, having its origin within the radiation spot 101. Optionally this may correspond with the coordinate system shown in FIG. 3.

$X_{int}$, representing the optical interaction effects of the target, for example representing an asymmetry or a non-uniformity of the target, is representative for the fact that the radiation might not be reflected exactly the same by the entire target. For example, due to imperfections during manufacturing, some parts of the target may deviate in thickness, reflectiveness, or other characteristics affecting the reflection of radiation. Also contamination on a part of the target may contribute to $X_{int}$.

FIGS. 5a-5c illustrate an embodiment of the method according to the invention, wherein the surface 130 at which the target 201 is arranged may be an upper surface 130 of a calibration object (carrier) 200, and the determining the first measured position of the target 201 is done while the calibration object 200 is in a first position, e.g., the position shown in FIG. 5a. In this embodiment, the method further comprises the following steps: after determining the first measured position of the target 201, arranging the calibration object 200 in a second position, wherein the calibration object 200 is at least rotated relative to the first position, for example, rotated to the position shown in FIG. 5c; emitting, with the radiation source 202, a second emitted radiation beam 203' onto the surface 130 to create the radiation spot 101, wherein at least a part of the target 201 is irradiated by the radiation spot 101; receiving, with the detector 205, a second reflected radiation beam 204' at least comprising radiation from the radiation spot 101 reflected by the target 201 while the calibration object 200 is in the second position; detecting the presence of the target 201 based on the second reflected radiation beam 204'; determining a second measured position of the target 201 based on the second reflected radiation beam 204'. The step of determining the center of the radiation spot 101 is done based on both the first measured position and the second measured position of the target 201.

The invention may also relate to a stage apparatus 300 comprising the sensor according to the invention, an object holder 210 configured to hold an object, which is to be subjected to a measurement of the sensor, an object handler 220 configured to arrange the object on the object holder 210, and a control unit 305. The control unit 305 may be configured to control the object handler 220 to arrange a calibration object 200 at the object holder 210 in a first position, e.g., the position shown in FIG. 5a, wherein said target 201 may be arranged at an upper surface 130 of the calibration object 200. The control unit 305 may also be configured to, after the detector 205 of the sensor has received the first reflected radiation beam 204 while the calibration object 200 is in the first position, arrange the calibration object 200 in a second position. In the second position, which may be the position shown in FIG. 5c, the calibration object 200 is at least rotated relative to the first position. The processing unit 306 of the sensor may be further configured to determine a second measured position of the target 201 based on a second reflected radiation beam 204' received by the detector 205 and at least comprising radiation from the radiation spot 101 reflected by the target 201 when the calibration object 200 is in the second position and the radiation source 202 emits a second emitted radiation beam 203' onto the surface 130 to create the radiation spot 101 such that at least a part of the target 201 is irradiated by the radiation spot 101. The processing unit 306 may be further configured to determine the center of the radiation spot 101 based on both the first measured position and the second measured position of the target 201.

In these embodiments, the target 201 may be arranged on a calibration object 200. The calibration object 200 may, for example, be an object specifically designed for the calibration of the sensor, or a first object of a series of objects to be handled by the stage apparatus 300. The calibration object 200 may be arranged in a second position, which is different from the first position. In the second position the calibration object 200 is at least rotated relative to the first position. A second measured position of the target 201 is determined when the calibration object 200 is in the second position, allowing to more accurately determine the center of the radiation spot 101. For example, a second equation according to formula (3) above can be determined, from which $X_{111}$ can be derived.

It may, in particular, be advantageous to arrange the second position such that one or more of the contributors in formula (3) above cancel each other out, or at least to such a degree that the resulting error is within an acceptable range. For example, the second position may be such that $X_{201}$ and/or $X_{int}$ is the same, opposite, or proportional by a known factor relative to the first position. As such, a combination of both formulas (3) may be made wherein at least one of $X_{201}$ and $X_{int}$ does not need to be determined, for example, because it is cancelled or least so small that it is neglectable.

For example, in an embodiment of the method the calibration object 200 is rotated by 170 to 190 degrees around an axis substantially perpendicular to the upper surface 130, preferably by substantially 180 degrees, in the second position relative to the first position. For example, in an embodiment of the stage apparatus 300, the object handler 220 is configured to arrange the calibration object 200 in the second position such that the calibration object 200 is rotated by 170 to 190 degrees around an axis substantially perpendicular to the upper surface 130, preferably by substantially 180 degrees, relative to the first position. Optionally the calibration object 200 may also be moved in a translational direction in the second position relative to the first position, for example, in horizontal or vertical direction.

By rotating the calibration object 200 by 180 degrees, the actual geometric center $X_{201}$ of the radiation spot 101 is in an opposite position in the first direction X in the second position relative to the first position. Also the part that represents the optical interaction with the target, $X_{int}$, is opposite in the second position relative to the first position. When combining the formula (3) above as obtained in the first position and as obtained in the second position, $X_{201}^{0\ deg}$ and $X_{201}^{180\ deg}$ cancel each other out, as do $X_{int}^{0\ deg}$ and $X_{int}^{180\ deg}$. It is noted that a rotation deviating from 180 degrees to a relatively small degree may result in an error that is within an acceptable range. Meanwhile $X_{111}$ remains the same. The result can be rewritten as formula (4):

$$X_{111} = \frac{-\left(X_{meas}^{0deg} + X_{meas}^{180deg}\right)}{2}. \tag{4}$$

As can be seen, the center-of-mass of the radiation spot 111 may be determined from the first measured position and the second measured position. Advantageously there is no need to know or determine the optical interaction effects of the target 201, for example the asymmetry of the target, nor the actual position of the target 201. It may be sufficient to know an approximate position of the target 201 and perform measurements in the vicinity of the target 201 until the target 201 is detected from the first reflected radiation beam 204 by the processing unit 306.

In an embodiment, a center of the radiation spot 101 is determined in a second direction Y. Optionally the second direction Y is perpendicular to the first direction X. Optionally at least one or both of the first X and second direction Y are arranged in the horizontal plane XY. As previously mentioned, the center of the radiation spot 101 in the second direction Y may be determined in a similar manner as used to determine the center in the X-direction. This means that in the formulas the X-coordinates may be replaced by its counter part in the Y-direction. Herewith, one may obtain for $Y_{meas}$:

$$Y_{meas} = Y_{201} + Y_{int} - Y_{111}. \quad (5)$$

In this formula, $Y_{201}$ is the actual geometrical center of the target in the Y-direction, $Y_{int}$ is a term that represents the optical interaction effects (spectral, diffraction, interference, non-uniform reflectivity effects etc.), and $Y_{111}$ represents the center-of-mass of the radiation spot 101. For example, $Y_{int}$ may represent an asymmetry or a non-uniformity of the target in the Y-direction. So, the deviation of the first measured position $Y_{meas}$ from the actual geometric center $Y_{201}$ of the target 201 may be at least partly contributed to the center of the radiation spot 101, which may be unknown. However, using the measured position $Y_{meas}$, said center 111 may be determined by using the formulas above. Optionally $Y_{meas}$, $Y_{201}$, $Y_{int}$, and $Y_{111}$ may be expressed relative to a coordinate system, for example, having its origin within the radiation spot 101. Optionally this may correspond with the coordinate system shown in FIG. 3.

Figure 6:
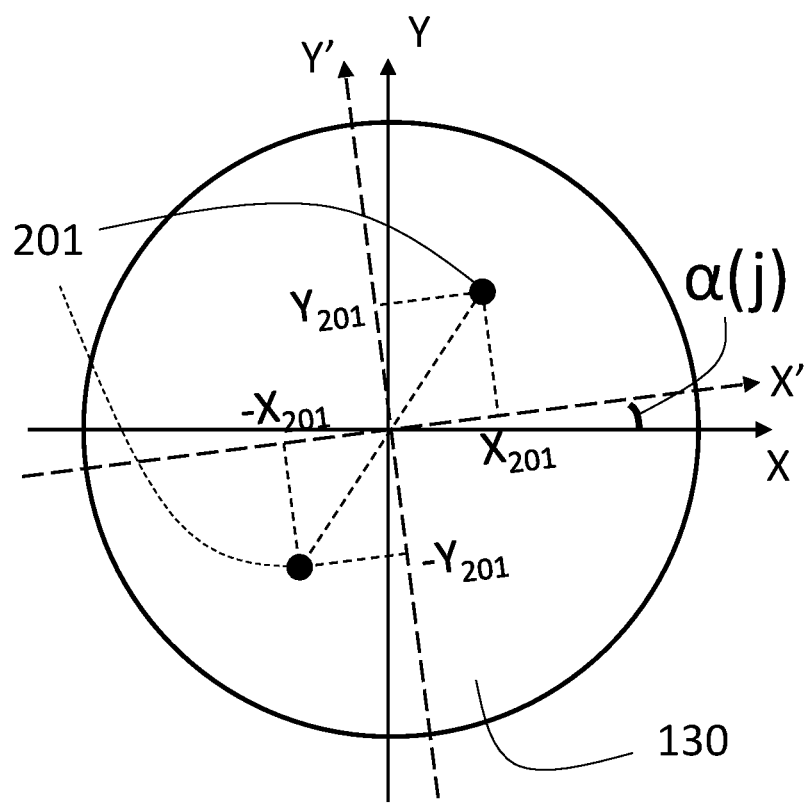
FIG. 6 schematically illustrates a target at a first and a second position.

In practice, $X_{201}$ ($Y_{201}$) does not to be accurately known. $X_{int}$ ($Y_{int}$) may engineered to be negligible, for example, by manufacturing a uniform reflecting target. Otherwise, the target needs to be independently determined. Assuming $X_{int}$ ($Y_{int}$)≈0, one may determine $X_{111}$ and $Y_{111}$ by measurements performed at various target rotations α(j) with respect to the reference coordinate system, see FIG. 6:

$$X_{111}(j) = \sqrt{X_{201}^2 + Y_{201}^2} \cdot \cos\left[\arctan\left(\frac{Y_{201}}{X_{201}}\right) + \alpha(j)\right] - X_{meas}^{\alpha(j)}, \text{ and} \quad (6)$$

$$Y_{111}(j) = \sqrt{X_{201}^2 + Y_{201}^2} \cdot \sin\left[\arctan\left(\frac{Y_{201}}{X_{201}}\right) + \alpha(j)\right] - Y_{meas}^{\alpha(j)}. \quad (7)$$

In equations (6) and (7), arctan($Y_{201}/X_{201}$) is an rotation angle with respect to a coordinate system (indicated by X'Y') of the upper surface 130. Based on equations (6) and (7), $X_{111}$ and $Y_{111}$ may be determined by nonlinear least squares fitting. In principle, two measurements at two different rotations would be sufficient to determine the center-of-mass of the radiation spot with the required accuracy. Linear regression may be suitable to determine $X_{111}$ and $Y_{111}$. In particular, a first measurement performed at a first rotation α(1) and the second measurement is performed at a second rotation α(2), with α(2)=α(1)+π, one may determine the coordinates of the center-of-mass of the radiation spot 101 by:

$$X_{111} = -\frac{X_{meas}^{\alpha} + X_{meas}^{\alpha+\pi}}{2}, \text{ and} \quad (8)$$

$$Y_{111} = -\frac{Y_{meas}^{\alpha} + Y_{meas}^{\alpha+\pi}}{2}. \quad (9)$$

In an embodiment, the stage apparatus 300 may comprise an alignment sensor 251, which for the sake of clarity is only illustrated in FIG. 5b. The alignment sensor 251 may emit radiation, for example, being an optical sensor arranged above the object holder 210 such that it emits and detects an alignment sensor beam 252 of radiation. In some embodiments, a main function of the alignment sensor 251 may be to align an object on the object holder 210.

In an embodiment, the control unit 305 is configured to control the object handler 220 to arrange the calibration object 200 in the second position using measurement data obtained by the alignment sensor 251. In an embodiment the method according to the invention the step of arranging the calibration object 200 in the second position includes aligning the calibration object 200 using measurement data obtained an alignment sensor 251.

Optionally measurement data obtained by the alignment sensor 251 may also be used when arranging the calibration object 200 in the first position.

One of the advantages of using the alignment sensor 251 is that the calibration object 200 may be arranged more accurately, e.g., allowing to more accurately arrange the 180 degrees rotation between the first and second position.

In the shown embodiment, the target 201 is an orthobox which contains four target areas. This allows for easy detection in four rotations: 0, 90, 180, 270 degrees. It is noted that an orthobox may in some embodiments also be used by the alignment sensor 251 to determine a position of, for example, an object such as a substrate or wafer. Advantageously the same orthobox may be used for determining the center of the radiation spot 101.

Figure 7A:
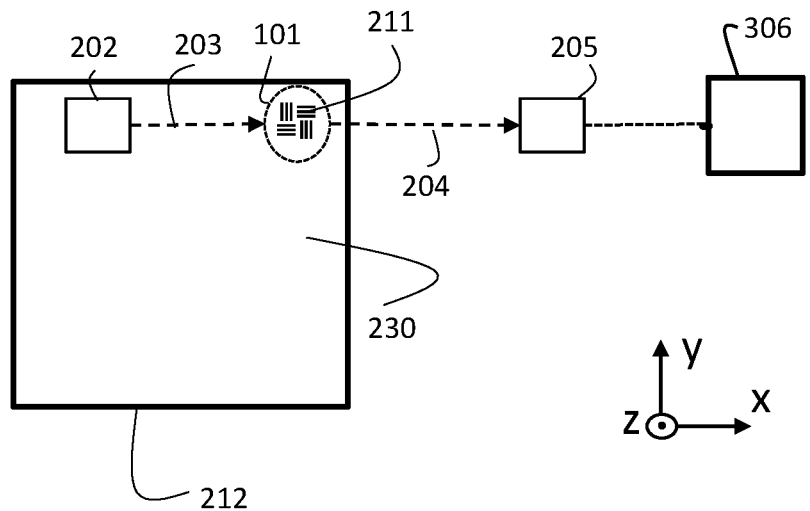
FIGS. 7a and 7b schematically illustrate an embodiment according the invention.
Figure 7B:
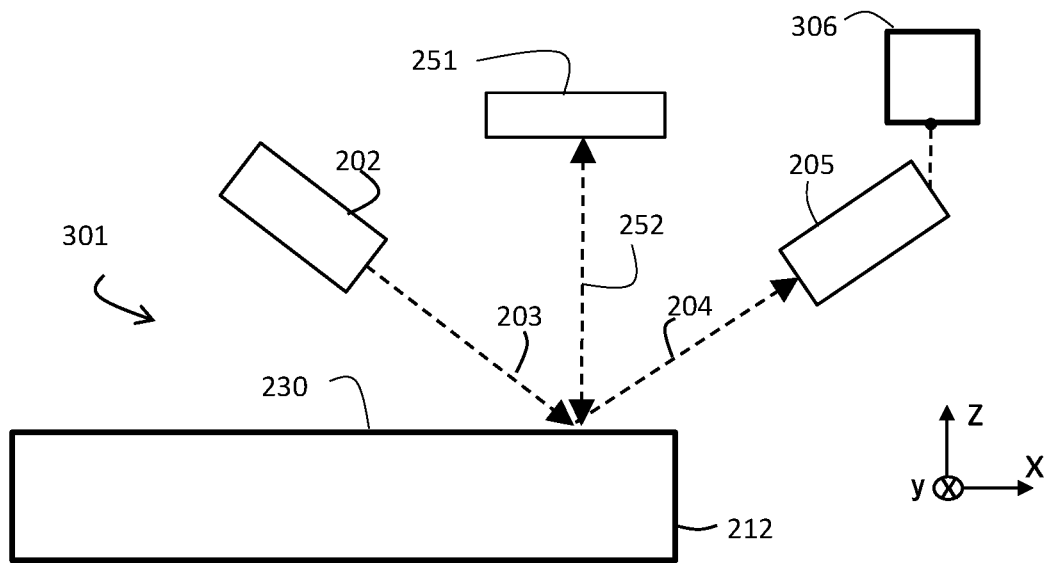

FIG. 7a, in top view, and FIG. 7b, in side view, schematically illustrate another arrangement. In particular, in embodiment, the invention relates to a stage apparatus 301 comprising the sensor according to the invention, and an object holder 212 configured to hold an object, which is to be subjected to a measurement of the sensor, wherein the surface at which the target 211 is arranged is a surface 230 of the object holder 212. Also in an embodiment of the method, the surface at which the target 211 is arranged is a surface 230 of an object holder 212 configured to hold an object, which may be subjected to a measurement by means of the sensor. Advantageously, this embodiment allows to determine the center of the radiation spot 101 without the need of an additional calibration object.

In an embodiment, the target 211 may be arranged at a corner of the object holder 212. In some cases, e.g., in some lithographic processes, there may already be targets present here used for determining a position the object holder 212. Advantageously the same target may be used for determining the center for the radiation spot 101.

As illustrated in FIG. 7b, the stage apparatus 301 may also comprise the alignment sensor 251 in an embodiment. The alignment sensor 251 may be configured to determine a first alignment position of the target 211. The processing unit 306 may further be configured to determine the center of the radiation spot 101 based on the first alignment position. In an embodiment, the method according to the invention comprises the step of determining at least a first alignment position of the target 211 with the alignment sensor 251, wherein the determining of the center of the radiation spot 101 is further done based on the first alignment position.

The first alignment position of the target 211 corresponds with the position of the target 211 as determined using the alignment sensor 251. In general, the alignment sensor 251 may be configured to determine the first alignment position of the target 211 with relatively high accuracy. The first alignment position may, for example, be considered to correspond, or at least within an acceptable error margin, with the actual position of the target 211. For example, the first alignment position may be considered to correspond to $X_{201}$ and/or $Y_{201}$. If also the optical interaction term of the target, i.e., $X_{int}$ and/or $Y_{int}$, is known or can be estimated, the center-of-mass coordinate $X_{111}$ and/or $Y_{111}$ may be determined. $X_{int}$ and/or $Y_{int}$ may, for example, be known from the manufacturing process of the target 211 or object holder 212, and/or from earlier measurements, e.g., using methods similar to those for deriving $X_{111}$ and/or $Y_{111}$ as explained herein. This embodiment may in particular be advantageous in combination with the embodiment shown in FIG. 7a-7b, because in practice it may not be possible to arrange the object holder 212 in a second position wherein it is rotated relative to a first position. However, it may also be advantageous in combination with one of the embodiments illustrated by FIGS. 5a-5c, as it allows to reduce the number of positions to arrange the calibration object 200 needed to determine $X_{111}$ and/or $Y_{111}$.

Referring now to FIGS. 5a-5c as well as FIGS. 7a-7b, in an embodiment the determining of the center of the radiation spot 101 may further based on an asymmetry parameter of the target 201, 211. The asymmetry parameter may represent asymmetry in the first reflected radiation beam 204 caused by the target 201, 211. For example, the asymmetry parameter may be considered to correspond to $X_{int}$ and/or $Y_{int}$. The asymmetry parameter may, for example, be known from the manufacturing process of the target 201, 211, the calibration object 200, or object holder 212, and/or from earlier measurements, e.g., using methods similar to those for deriving $X_{111}$ and/or $Y_{111}$ as explained herein.

In an embodiment, the method may comprise a step of determining a correction factor for correcting measurements obtained by the sensor in a third direction Z. Optionally the third direction is perpendicular to both the first direction X and the second direction Y, e.g., the third direction Z being vertical. The correction factor may be based on the calibrated tilt invariant point as explained above.

In an embodiment the radiation spot 101 may have a size in the order of mm², e.g., with dimensions of 0.5-5×0.5-5 mm², for example, 1×1 mm², 1×2 mm², 1×2.5 mm², 1×3 mm², or 2×2 mm².

In an embodiment the sensor is configured to irradiate the surface 130, 230 with a plurality of radiation spots 101, for example, an array of radiation spots 101. The array of radiation spots may be an one-dimensional or a two-dimensional array. In an embodiment the method and/or sensor or stage apparatus 300, 301 according to the invention may be used to determine a center of a center radiation spot 101, which is arranged in the center of the plurality of radiation spots 101. In an embodiment the method and/or sensor or stage apparatus 300, 301 according to the invention may be used to determine a center of multiple of the plurality of radiation spots 101. In an embodiment the method and/or sensor or stage apparatus 300, 301 according to the invention may be used to determine a center of the plurality of radiation spots 101.

In an embodiment multiple targets 201, 211 are provided, for example, at the calibration object 200 and/or the object holder 210. The determination of the center of the radiation spot 101 may then be done based on multiple of the targets 201, 211, thereby increasing accuracy.

The invention further relates to a method for calibrating a sensor comprising a radiation source 202 and a detector 205, said method comprising a step of determining a center of a radiation spot 101 irradiated on a surface 130, 230 by the sensor according to a method according to the invention. The method further comprises the step of configuring a processing unit 306 to, based on the determined center of the radiation spot 101: adjust a measurement or measurement data obtained by the sensor; and/or adjust, for an object, which is to be subjected to a measurement of the sensor, which area of a surface of said object is to be irradiated with the radiation spot 101. Advantageously the determined center of the radiation spot 101 is used to calibrate the sensor. This may be done by correcting the output of the sensor, i.e., the measurement or measurement data, and/or by correcting the input of the sensor, i.e., the area to irradiate, e.g., to ensure that the radiation spot 101 is completely at the surface to be irradiated.

The invention further relates to an apparatus comprising a stage apparatus 300, 301 according to one of the embodiments of the invention. The apparatus may, for example, be a lithographic apparatus, e.g., as shown in FIG. 1, wherein the substrate support WT corresponds with the object support 210, 212. The apparatus may, for example, be a shaping apparatus for forming a three-dimensional object on a target surface. The apparatus may also be a metrology apparatus, a particle beam apparatus, an electron beam apparatus, an electron beam inspection apparatus, or an inspection apparatus. Advantageously the apparatus may be used more accurately using the invention.

The invention further relates to a device manufacturing method comprising transferring a pattern from a patterning device onto a substrate, comprising the step of using a lithographic apparatus comprising a stage apparatus 300, 301 according to one or more of the embodiments according to the invention. Advantageously the pattern may be transferred more accurately using the invention, e.g., because a more accurate height map can be determined because the center of the radiation spot of the level sensor is determined using the invention.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography. Applications may also include, the manufacturing of three-dimensional models by rapid prototyping (sometimes referred to as 3D printing, or additional production, or direct digital production).

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

Aspects of the invention are set out in the clauses below.

1. Method for determining a center of a radiation spot irradiated on a surface by a sensor, the sensor comprising a radiation source and a detector, the method comprising the following steps: emitting, with the radiation source, a first emitted radiation beam onto the surface to create the radiation spot on the surface, wherein at least a part of a target arranged at the surface is irradiated by the radiation spot, receiving, with the detector, a first reflected radiation beam at least comprising radiation from the radiation spot reflected by the target, detecting the presence of the target based on the first reflected radiation beam, determining a first measured position of the target based on the first reflected radiation beam, determining a center of the radiation spot as projected on the surface in at least a first direction based on the first measured position of the target.

2. Method according to clause 1, wherein the surface at which the target is arranged is an upper surface of an object, the determining the first measured position of the target is done while the object is in a first position, wherein the method further comprises the following steps: after receiving the first reflected radiation beam while the object is in the first measured position, arranging the object in at least a second position wherein the object is at least rotated relative to the first position, emitting, with the radiation source, at least a second emitted radiation beam onto the surface to create the radiation spot, wherein at least a part of the target is irradiated by the radiation spot, receiving, with the detector, at least a second reflected radiation beam at least comprising radiation from the radiation spot reflected by the target while the object is in the at least second position, detecting the presence of the target based on at least the second reflected radiation beam, determining at least a second measured position of the target based on at least the second reflected radiation beam, wherein the step of determining the center of the radiation spot is done based on both the first measured position and at least the second measured position of the target.

3. Method according to clause 2, wherein the object is rotated around an axis substantially perpendicular to the upper surface in at least the second position relative to the first position.

4. Method according to any of the preceding clauses, wherein further a center of the radiation spot is determined in at least a second direction.

5. Method according to clause 2, further comprising the step of determining a center of the radiation spot by at least one of nonlinear least square fitting and linear regression.

6. Method according to any of the clauses 2-5, wherein the step of arranging the object in at least the second position includes aligning the object using measurement data obtained by an alignment sensor.

7. Method according to clause 1, wherein the surface at which the target is arranged is a surface of an object holder configured to hold an object which is to be subjected to a measurement of the sensor.

8. Method according to one or more of the preceding clauses, further comprising the step of determining at least a first alignment position of the target with an alignment sensor, wherein the determining of the center of the radiation spot is further done based on the first alignment position.

9. Method according to one or more of the preceding clauses, wherein the determining of the center of the radiation spot is further based on an optical interaction parameter of the target.

10. Method for calibrating a sensor comprising a radiation source and a detector, the method comprising: determining a center of a radiation spot irradiated on a surface by the sensor according to a method according to one or more of the preceding clauses, and configuring a processing unit to, based on the determined center of the radiation spot: adjust a measurement or measurement data obtained by the sensor, and/or adjust, for an object which is to be subjected to a measurement of the sensor, which area of a surface of said object is to be irradiated with the radiation spot.

11. Sensor comprising: a radiation source configured to emit first emitted radiation beam onto a surface to create a radiation spot, wherein at least a part of a target arranged at the surface is irradiated by the radiation spot, a detector configured to receive a first reflected radiation beam at least comprising radiation from the radiation spot reflected by the target, a processing unit configured to: detect the presence of the target based on the first reflected radiation beam, determine a first measured position of the target based on the first reflected radiation beam, determine a center of the radiation spot as projected on the surface in at least a first direction based on the first measured position of the target.

12. Sensor according to clause 11, wherein the processing unit is configured to detect the presence of the target based on a characteristic of the first reflected radiation beam exceeding a threshold.

13. Stage apparatus, comprising: the sensor according to clause 11 or clause 12, an object holder configured to hold an object which is to be subjected to a measurement of the sensor, an object handler configured to arrange the object on the object holder, a control unit configured to control the object handler to arrange the object on the object holder in a first position, wherein said target is arranged at an upper surface of the calibration object, and after the detector of the sensor has received the first reflected radiation beam while the object is in the first position, arrange the calibration object in at least a second position wherein the object is at least rotated relative to the first position, wherein the processing unit of the sensor is further configured to determine at least a second measured position of the target, based on at least a second reflected radiation beam received by the detector and at least comprising radiation from the radiation spot reflected by the target when the object is in at least the second position and the radiation source emits at least a second emitted radiation beam onto the surface to create the radiation spot such that at least a part of the target is irradiated by the radiation spot, determine the center of the radiation spot based on both the first measured position and at least the second measured position of the target.

14. Stage apparatus according to clause 13, wherein the object handler is configured to arrange the object in the second position such that the calibration object is rotated around an axis substantially perpendicular to the upper surface relative to the first position.

15. Stage apparatus according to clause 13 or clause 14, further comprising an alignment sensor, wherein the control unit is configured to control the object handler to arrange the object in at least the second position using measurement data obtained by the alignment sensor.

16. Stage apparatus, comprising: the sensor according to clause 11 or clause 12, an object holder configured to hold an object which is to be subjected to a measurement of the sensor, wherein the surface at which the target is arranged is a surface of the object holder.

17. Stage apparatus according to one or more of the clauses 13-16, further comprising an alignment sensor configured to determine a first alignment position of the target, wherein the processing unit further is configured to determine the center of the radiation spot based on the first alignment position.

18. Apparatus comprising a stage apparatus according to one or more of the clauses 13-17, wherein the apparatus is at least one of a lithographic apparatus, a metrology apparatus, a particle beam apparatus, an electron beam apparatus, an electron beam inspection apparatus, a shaping apparatus, and an inspection apparatus.

19. A device manufacturing method comprising transferring a pattern from a patterning device onto a substrate, comprising the step of using a lithographic apparatus comprising a stage apparatus according to any of clauses 13-17.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. A method for determining a center of a radiation spot irradiated on a surface by a sensor, the sensor comprising a radiation source and a detector, the method comprising:
    emitting, with the radiation source, a first emitted radiation beam onto the surface to create the radiation spot on the surface, wherein at least a part of a target arranged at the surface is irradiated by the radiation spot,
    receiving, with the detector, a first reflected radiation beam at least comprising radiation from the radiation spot reflected by the target,
    detecting the presence of the target based on the first reflected radiation beam,
    determining a first measured position of the target based on the first reflected radiation beam, and
    determining a center of the radiation spot as projected on the surface in at least a first direction based on the first measured position of the target.

2. The method according to claim 1, wherein
    the surface at which the target is arranged is an upper surface of an object,
    the determining the first measured position of the target is done while the object is in a first position,
    wherein the method further comprises:
    after receiving the first reflected radiation beam while the object is in the first measured position, arranging the object in at least a second position wherein the object is at least rotated relative to the first position,
    emitting, with the radiation source, at least a second emitted radiation beam onto the surface to create the radiation spot, wherein at least a part of the target is irradiated by the radiation spot,
    receiving, with the detector, at least a second reflected radiation beam at least comprising radiation from the radiation spot reflected by the target while the object is in the at least second position,
    detecting the presence of the target based on the at least the second reflected radiation beam,
    determining at least a second measured position of the target based on the at least second reflected radiation beam,
    wherein the determining the center of the radiation spot is done based on both the first measured position and the at least the second measured position of the target.

3. The method according to claim 2, wherein the object is rotated around an axis substantially perpendicular to the upper surface in the at least the second position relative to the first position.

4. The method according to claim 1, wherein further a center of the radiation spot is determined in at least a second direction.

5. The method according to claim 2, further comprising determining a center of the radiation spot by nonlinear least square fitting and/or linear regression.

6. The method according to claim 2, wherein the arranging the object in the at least second position includes aligning the object using measurement data obtained by an alignment sensor.

7. The method according to claim 1, wherein the surface at which the target is arranged is a surface of an object holder configured to hold an object which is to be subjected to a measurement of the sensor.

8. The method according to claim 1, further comprising determining at least one alignment position of the target with an alignment sensor, wherein the determining of the center of the radiation spot is further done based on the at least one alignment position.

9. The method according to claim 1, wherein the determining of the center of the radiation spot is further based on an optical interaction parameter of the target.

10. A method for calibrating a sensor comprising a radiation source and a detector, the method comprising:
    determining a center of a radiation spot irradiated on a surface by the sensor according to the method of claim 1, and
    configuring a processing unit to, based on the determined center of the radiation spot:
    i. adjust a measurement or measurement data obtained by the sensor, and/or
    ii. adjust, for an object which is to be subjected to a measurement of the sensor, which area of a surface of the object is to be irradiated with the radiation spot.

11. A sensor comprising:
    a radiation source configured to emit first emitted radiation beam onto a surface to create a radiation spot, wherein at least a part of a target arranged at the surface is irradiated by the radiation spot,
    a detector configured to receive a first reflected radiation beam at least comprising radiation from the radiation spot reflected by the target, a processing unit configured to:

i. detect the presence of the target based on the first reflected radiation beam, ii. determine a first measured position of the target based on the first reflected radiation beam, and iii. determine a center of the radiation spot as projected on the surface in at least a first direction based on the first measured position of the target.

12. The sensor according to claim 11, wherein the processing unit is configured to detect the presence of the target based on a characteristic of the first reflected radiation beam exceeding a threshold.

13. An apparatus, comprising:

the sensor according to claim 11, an object holder configured to hold an object which is to be subjected to a measurement of the sensor, an object handler configured to arrange the object on the object holder, and a control unit configured to control the object handler to:

i. arrange the object on the object holder in a first position, wherein the target is arranged at an upper surface of the calibration object, and ii. after the detector of the sensor has received the first reflected radiation beam while the object is in the first position, arrange the object in at least a second position wherein the object is at least rotated relative to the first position, wherein the processing unit of the sensor is further configured to:

i. determine at least a second measured position of the target, based on at least a second reflected radiation beam received by the detector and at least comprising radiation from the radiation spot reflected by the target when the object is in the at least second position and wherein the at least second reflected radiation beam is due to the radiation source emitting at least a second emitted radiation beam onto the surface to create the radiation spot such that at least a part of the target is irradiated by the radiation spot, and ii. determine the center of the radiation spot based on both the first measured position and the at least second measured position of the target.

14. The apparatus according to claim 13, wherein the object handler is configured to arrange the object in the at least second position such that the object is rotated around an axis substantially perpendicular to the upper surface relative to the first position.

15. The apparatus according to claim 13, further comprising an alignment sensor, wherein the control unit is configured to control the object handler to arrange the object in the at least second position using measurement data obtained by the alignment sensor.

16. The apparatus according to claim 13, further comprising an alignment sensor configured to determine an alignment position of the target, wherein the processing unit further is configured to determine the center of the radiation spot based on the alignment position.

17. An apparatus, comprising:

the sensor according to claim 11, and an object holder configured to hold an object which is to be subjected to a measurement of the sensor, wherein the surface at which the target is arranged is a surface of the object holder.

18. The apparatus according to claim 17, further comprising an alignment sensor configured to determine an alignment position of the target, wherein the processing unit further is configured to determine the center of the radiation spot based on the alignment position.

19. A tool comprising the apparatus according to claim 13, wherein the tool is at least one selected from: a lithographic apparatus, a metrology apparatus, a particle beam apparatus, an electron beam apparatus, an electron beam inspection apparatus, a shaping apparatus, and/or an inspection apparatus.

20. A device manufacturing method involving transferring a pattern from a patterning device onto a substrate, the method comprising using a lithographic apparatus comprising the apparatus according to claim 13.

* * * * *